US009225325B2

(12) United States Patent
De Geronimo

(10) Patent No.: US 9,225,325 B2
(45) Date of Patent: Dec. 29, 2015

(54) METHOD AND APPARATUS FOR SUB-HYSTERESIS DISCRIMINATION

(71) Applicant: Brookhaven Science Associates, LLC, Upton, NY (US)

(72) Inventor: Gianluigi De Geronimo, Syosset, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 0 days.

(21) Appl. No.: 14/471,617

(22) Filed: Aug. 28, 2014

(65) Prior Publication Data

US 2015/0061729 A1 Mar. 5, 2015

Related U.S. Application Data

(60) Provisional application No. 61/871,886, filed on Aug. 30, 2013.

(51) Int. Cl.
*H03K 5/22* (2006.01)
*H03K 5/24* (2006.01)

(52) U.S. Cl.
CPC .................................. *H03K 5/2481* (2013.01)

(58) Field of Classification Search
None
See application file for complete search history.

(56) References Cited

U.S. PATENT DOCUMENTS

| 4,940,907 A | 7/1990 | Laude |
| 5,155,386 A | 10/1992 | Abdi |
| 5,166,550 A | 11/1992 | Matsubara et al. |
| 5,656,957 A | 8/1997 | Marlow et al. |
| 6,208,187 B1 | 3/2001 | Callahan, Jr. |
| 6,304,088 B1 | 10/2001 | Yee |
| 6,362,467 B1 | 3/2002 | Bray |
| 6,535,031 B1 * | 3/2003 | Nguyen et al. ................. 327/65 |
| 6,982,582 B1 | 1/2006 | Cheng |
| 7,187,207 B2 * | 3/2007 | Rowley ........................... 326/83 |
| 7,714,620 B1 | 5/2010 | Xu |
| 2007/0164801 A1* | 7/2007 | Chen et al. ................... 327/205 |
| 2014/0091846 A1* | 4/2014 | Agut ............................. 327/206 |

OTHER PUBLICATIONS

De Geronimo, G., et al., "VMM1—An ASIC for Micropattern Detectors," *IEEE Transactions on Nuclear Science*, vol. 60, No. 3, pp. 2314-2321, 2013.
De Geronimo, G., et al., "VMM1—An ASIC for Micropattern Detectors—Preliminary Results—," 10$^{th}$ RD51 Collaboration Meeting, State University of New York at Sony Brook, (Stony Brook, New York, Oct. 1-4, 2012).
De Geronimo, G., et al., "VMM1—An ASIC for Micropattern Detectors," Topical Workshop on Electronics for Particle Physics, Oxford University, (Oxford, Sep. 17-21, 2012).

* cited by examiner

*Primary Examiner* — Long Nguyen
(74) *Attorney, Agent, or Firm* — Dorene M. Price; Lars O. Husebo

(57) ABSTRACT

Embodiments of comparator circuits are disclosed. A comparator circuit may include a differential input circuit, an output circuit, a positive feedback circuit operably coupled between the differential input circuit and the output circuit, and a hysteresis control circuit operably coupled with the positive feedback circuit. The hysteresis control circuit includes a switching device and a transistor. The comparator circuit provides sub-hysteresis discrimination and high speed discrimination.

4 Claims, 12 Drawing Sheets

METHOD AND APPARATUS FOR SUB-HYSTERESIS DISCRIMINATION

CROSS REFERENCES TO RELATED APPLICATIONS

This application claims priority to U.S. provisional application Ser. No. 61/871,886 filed Aug. 30, 2013, the content of which is incorporated herein in its entirety.

STATEMENT OF GOVERNMENT LICENSE RIGHTS

The present invention was made with government support under contract number DE-AC02-98CH10886, awarded by the U.S. Department of Energy. The Government has certain rights in this invention.

FIELD OF THE INVENTION

The present invention relates to signal discrimination, and more particularly to a method and apparatus for sub-hysteresis discrimination.

BACKGROUND

Signal discrimination is used in electronic systems to discriminate between signals of different amplitudes, such as in processing of signals from radiation sensors. FIG. 1 shows a block diagram of a typical electronic system 100 for radiation detectors, where a charge signal from a sensor 101 is first amplified with a low-noise charge amplifier 102, then filtered by a filter 103 resulting in a pulse. The pulse goes through a discrimination stage at a discriminator 110 and, if it exceeds a pre-determined threshold, it is processed to measure quantities of interest like, for example, the peak amplitude and/or the timing of the pulse at a processing stage 106.

Electronic systems like the one in FIG. 1 are affected by noise, which results in noise pulses at the output of the filter 103. The purpose of the discriminator is, in most cases, to discriminate between the pulses of interest and the noise pulses. This is achieved by comparing the pulse amplitude with the pre-determined threshold. If the threshold is exceeded, the pulse is processed by the processing stage 106, otherwise the pulse is ignored. Without discrimination, the processing stage 106 would be constantly engaged by the noise pulses, thus introducing a prohibitively long dead time (i.e., time during which the system is unable to process other pulses), which depends on the duration of the processing. Additionally, the electronic systems would generate a large amount of measurements on the noise pulses of no interest to users.

The discriminator 110 is typically composed of a comparator circuit 104 and a logic circuit 105. As previously said, the comparator circuit 104 compares the amplitude of a pulse to a pre-determined threshold and, if the threshold is exceeded, the comparator circuit 104 generates a logic signal. The logic signal is used by the logic circuit 105 to enable the processing of the pulse.

FIG. 2 illustrates a comparator circuit which compares signals at the positive input $V_i^+$, for example, the pulse generated in FIG. 1, with signals, for example, a threshold, at the negative input $V_i^-$. The circuit includes a current source $I_{bias}$, a differential input stage $M_i^+$ and $M_i^-$, two diode-connected transistors $M_d^+$ and $M_d^-$ providing two outputs $V_o^-$ and $V_o^+$ that will be converted into an actual logic signal by a next stage not shown in FIG. 2, and two cross-connected transistors $M_h^+$ and $M_h^-$. Comparator circuits are frequently required to provide a fast response independent of the amplitude of a pulse, meaning that the response of a comparator must be comparably fast when a threshold is exceeded by either a large amount (i.e., large pulses) or a small amount (i.e., small pulses). The fast response could be achieved by introducing a positive feedback in the circuit through the two cross-connected transistors $M_h^+$ and $M_h^-$, which are also known as hysteresis transistors.

The hysteresis transistors also introduce two different effective thresholds: an upper threshold, effective when the signal crosses the threshold with a positive slope; and a lower threshold, effective when the signal crosses the threshold with a negative slope. In the case of pulses, the comparator triggers on the upper threshold on the rising edge of a pulse, and it triggers back on the lower threshold on the falling edge of the pulse.

The hysteresis concept is illustrated in FIG. 3. The nominal threshold, i.e., the threshold voltage applied to one input of the comparator, typically, but not necessarily, sits about in the center on the hysteresis window, i.e. $\Delta V_h^+ \approx \Delta V_h^-$, and the total hysteresis $\Delta V_h$ is given by $\Delta V_h^+ + \Delta V_h^-$.

An example of response of the comparator circuit in FIG. 2 to a large pulse is illustrated in FIG. 4. FIG. 4 illustrates the input pulse at $V_i^-$ and the output ($V_o^+ - V_o^-$) of the comparator. It must be observed that once the comparator triggers on the positive slope of an input pulse, it is required that the comparator triggers back to the original state. Otherwise, it would not be able to discriminate the next pulse. Triggering back of the comparator to its original state can be achieved by using the falling edge of the pulse, which must cross the lower threshold as shown in FIG. 4.

However, hysteresis may introduce a limit on the minimum pulse amplitude that can be discriminated. As discussed above, the lower threshold cannot be set lower than the baseline of the pulses to be discriminated for the comparator to trigger back. Thus, the minimum pulse amplitude that can be discriminated may not be lower than the hysteresis window, i.e. $\Delta V_h$, as shown in FIG. 5. In FIG. 5, the comparator does not respond to pulses with amplitudes lower than the hysteresis window.

Attempts to reduce the value of the minimum amplitude that the comparator can discriminate may be found in a number of U.S. patents.

In U.S. Pat. No. 4,940,907, which is incorporated by reference in its entirety as if fully set forth in this specification, D. P. Laude discloses a system with adjustable hysteresis, where the hysteresis is small for low amplitude signals and increases for large amplitude signals. However, the small hysteresis of the comparator for small signals results in a limited speed of the comparator for small signals.

In U.S. Pat. No. 5,155,386, which is incorporated by reference in its entirety as if fully set forth in this specification, D. P. Laude discloses a system where the amount of hysteresis is programmable by users. However, the same limitations as discussed previously with respect to the U.S. Pat. No. 4,940,907 apply.

In U.S. Pat. No. 5,166,550, which is incorporated by reference in its entirety as if fully set forth in this specification, K. Matsubara et al. disclose a system where the threshold voltage, i.e., the reference voltage, is variable and a voltage is added to the signal in an amount proportional to the variable voltage. This system responds as having a variable hysteresis. However, if used with small signals, the small hysteresis of the comparator for small signals results in low speed, as in the disclosure of D. P. Laude. Furthermore, the threshold, in order to be variable, cannot be filtered, thus adding noise through the threshold input during the discrimination process. Further yet, the variable voltage added to the signal also adds noise to the signal being discriminated.

In U.S. Pat. No. 6,208,187, which is incorporated by reference in its entirety as if fully set forth in this specification, M. J. Callahan Jr. discloses a system where the hysteresis is adjusted in accordance with output signals. The hysteresis is obtained using a differential pair similar to $M_i^+$ and $M_i^-$ in FIG. 2 and by adding a certain amount of offset at the source or drain of one of the two transistors. The offset is controlled by introducing one or more resistors in the circuit and by enabling or disabling the resistor(s) depending on the state of the output (as described in FIGS. 3, 5, and 7 of U.S. Pat. No. 6,208,187). This results in a hysteresis where the lower and upper thresholds change depending on the state of the output. U.S. Pat. No. 6,208,187 also discloses an alternative circuit where the hysteresis is controlled by adding transistors either in parallel to the differential pair (as shown in FIG. 10 of U.S. Pat. No. 6,208,187) or at the drains of the differential pair (as shown in FIG. 11 of U.S. Pat. No. 6,208,187). However, the circuits proposed in U.S. Pat. No. 6,208,187 by M. J. Callahan Jr. lack positive feedback, which is critical to achieve a high speed discrimination. The loops present in the proposed circuits are only used to modify the hysteresis, and not to achieve a high speed in the comparator response.

In U.S. Pat. No. 6,362,467, which is incorporated by reference in its entirety as if fully set forth in this specification, D. Bray discloses a system where the speed of a comparator is increased by using a gain amplifier and a feedback from the output of the comparator to the input of the gain amplifier. However, the circuit in this system requires additional fast amplifiers, which implies additional power dissipation compared to a circuit using a single differential pair.

In U.S. Pat. No. 6,982,582, which is incorporated by reference in its entirety as if fully set forth in this specification, Yi Cheng discloses a system where a hysteresis comparator (e.g., the comparator 100 in FIGS. 1 and 400 in FIG. 4 in U.S. Pat. No. 6,982,582) is provided with an additional differential pair at the input (e.g., N3, N4 in FIG. 4 of U.S. Pat. No. 6,982,582) to control the position of the threshold, i.e. the position of the hysteresis window. The position of the hysteresis window can be adjusted using the circuit in FIG. 8 of U.S. Pat. No. 6,982,582. However, the window size would not be controllable since it is fixed in the hysteresis comparator, e.g., comparator 100 or 400, and it would require considerable amount of power in the input differential pair in order to rapidly switch the hysteresis window between the two positions since there is no positive feedback.

Therefore, as discussed above, none of the prior systems is able to provide signal discrimination that can discriminate signals with amplitudes lower than the hysteresis window with a high response speed and low power consumption.

SUMMARY

The embodiments of the present disclosure provide signal discrimination that can discriminate signals with amplitudes lower than the hysteresis window with a high response speed and low power consumption.

In an embodiment, a comparator circuit and a discriminator including such a comparator circuit are disclosed. The comparator circuit includes a differential input circuit that includes a first transistor coupled with a first signal input and a second transistor coupled with a second signal input. The comparator circuit further includes an output circuit that includes a third transistor generating a first output signal and a fourth transistor generating a second output signal. The difference between the first output signal and the second output signal indicates the voltage difference between the first signal input and the second signal input. The comparator circuit also includes a positive feedback circuit operably coupled between the differential input circuit and the output circuit. The positive feedback circuit includes a fifth transistor having a first terminal, a second terminal and a third terminal, and a sixth transistor having a first terminal, a second terminal and a third terminal. The comparator circuit further has a hysteresis control circuit operably coupled with the positive feedback circuit. The hysteresis control circuit includes a first switching device and a seventh transistor having a first terminal, a second terminal and a third terminal. The first terminal of the seventh transistor is coupled with the first terminal of the fifth transistor of the positive feedback circuit through the first switching device, and the second terminal of the seventh transistor is coupled with the second terminal of the fifth transistor of the positive feedback circuit.

The hysteresis control circuit of the comparator circuit may further include a second switching device and an eighth transistor that has a first terminal, a second terminal and a third terminal. The first terminal of the eighth transistor is coupled with the first terminal of the sixth transistor of the positive feedback circuit through the second switching device, and the second terminal of the eighth transistor is coupled with the second terminal of the sixth transistor of the positive feedback circuit.

BRIEF DESCRIPTION OF THE DRAWINGS

For a more complete understanding of the present invention, and for further advantages thereof, reference is now made to the following description taken in conjunction with the accompanying drawings in which:

FIG. 6 ($b$) is a diagram illustrating the input and output of a comparator with sub-hysteresis discrimination after the comparator triggers;

FIG. 7($b$) is a schematic diagram illustrating a comparator circuit with sub-hysteresis discrimination;

FIG. 7($c$) is a schematic diagram illustrating a comparator circuit with sub-hysteresis discrimination;

DETAILED DESCRIPTION

The following discussion is presented to enable a person skilled in the art to make and use the invention. Various modifications will be readily apparent to those skilled in the art, and the general principles described herein may be applied to embodiments and applications other than those detailed below without departing from the spirit and scope of the present invention as defined herein. The present invention is not intended to be limited to the embodiments shown, but is to be accorded the widest scope consistent with the principles and features disclosed herein.

Figure 1:
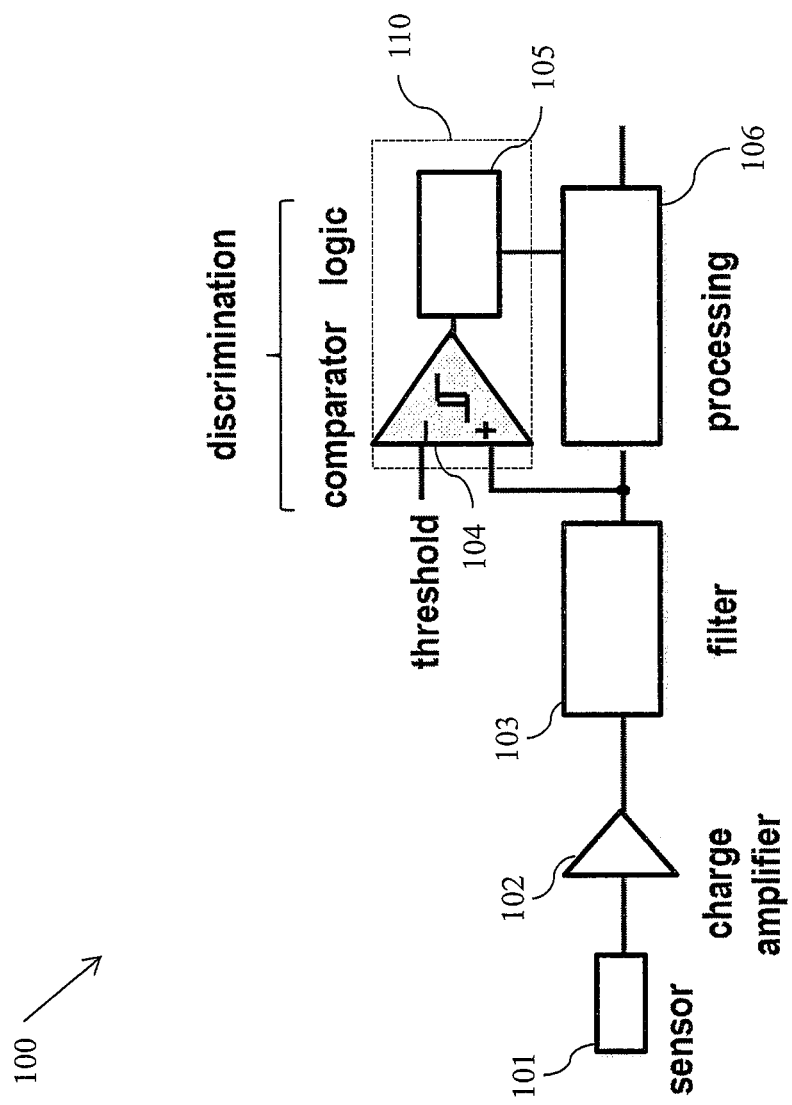
FIG. 1 is a block diagram illustrating an electronic system for radiation sensors from the prior art.
Figure 2:
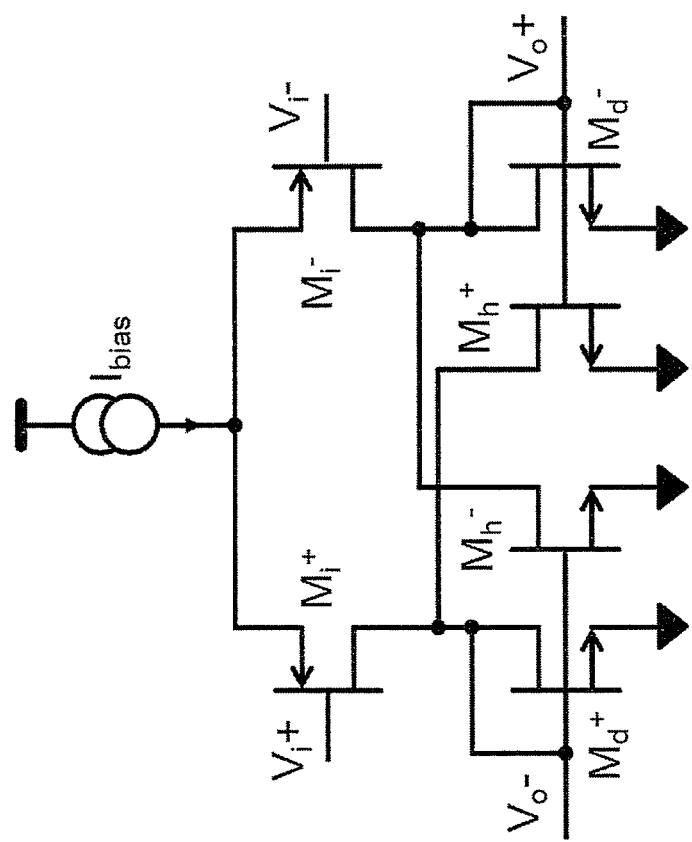
FIG. 2 is a schematic diagram of a comparator circuit from the prior art.
Figure 3:
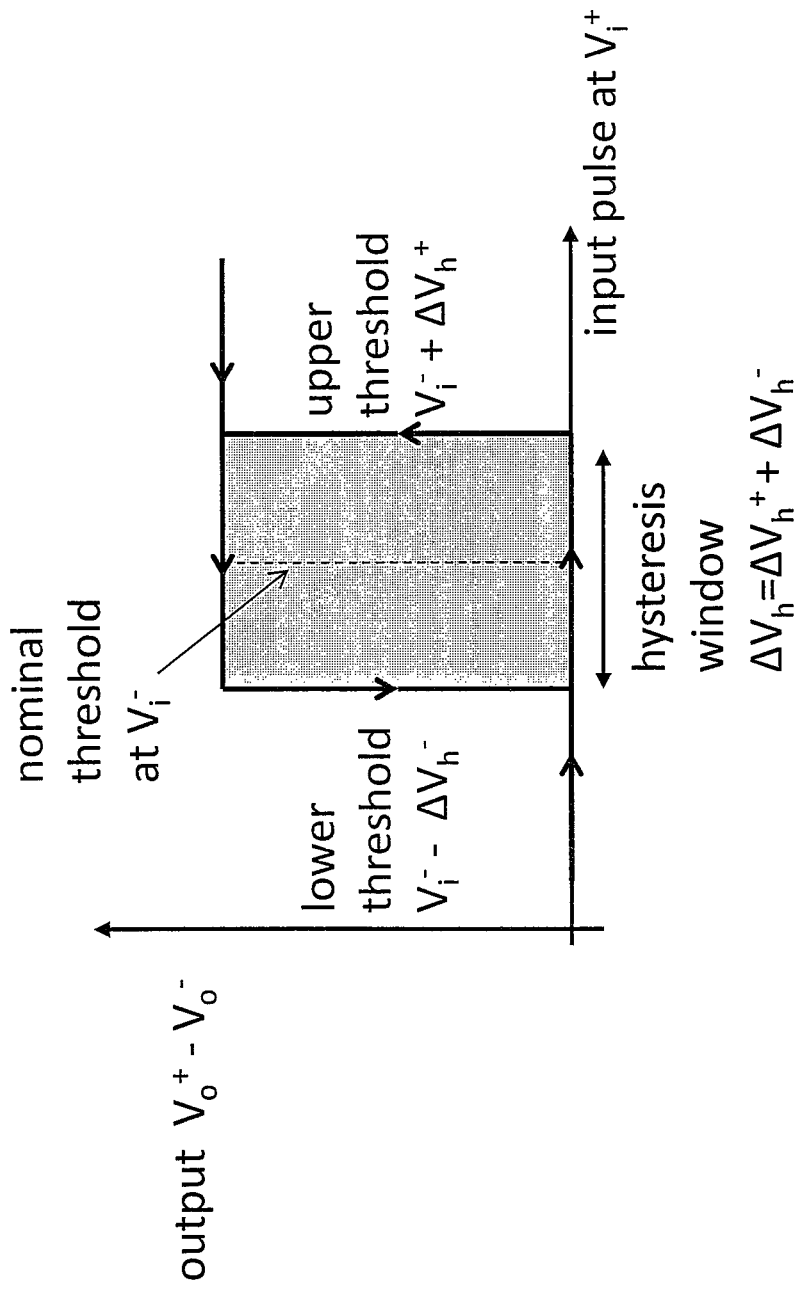
FIG. 3 is a diagram illustrating the hysteresis concept of a comparator from the prior art.
Figure 4:
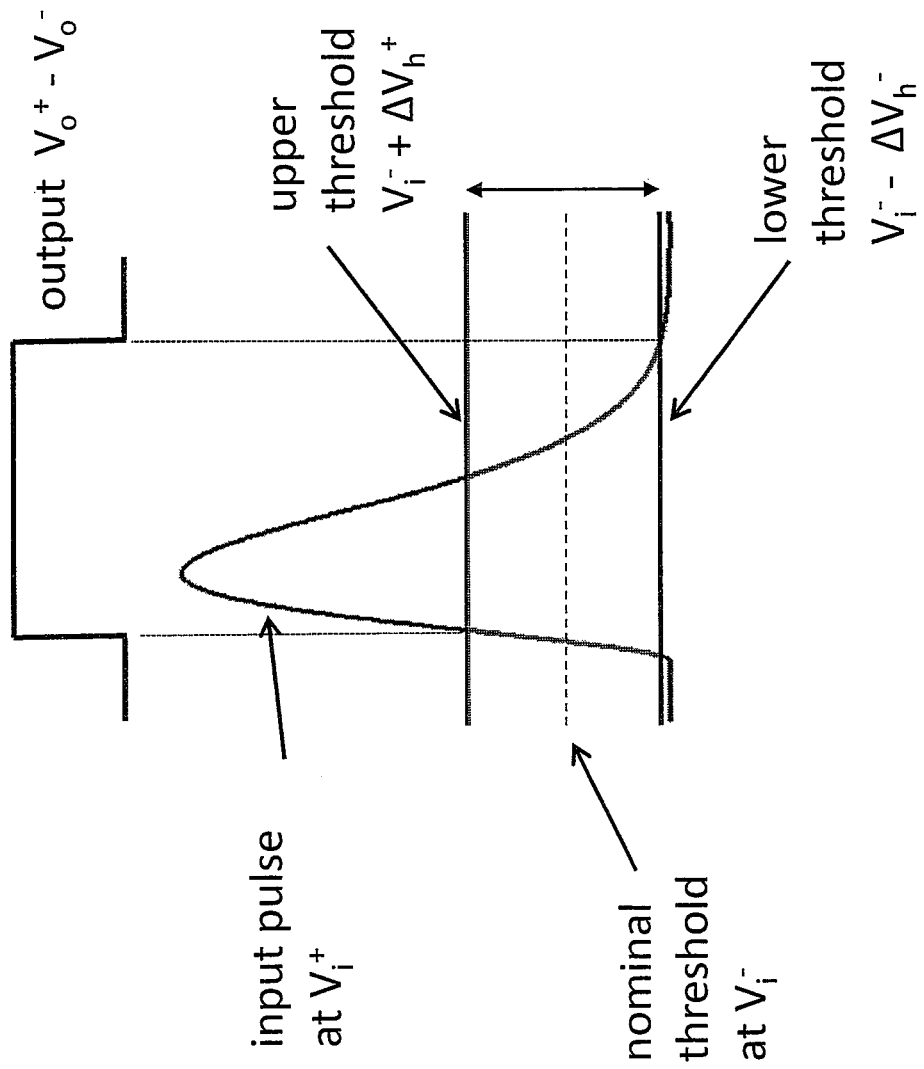
FIG. 4 is a diagram illustrating an example of a comparator's response to a large pulse from the prior art.
Figure 5:
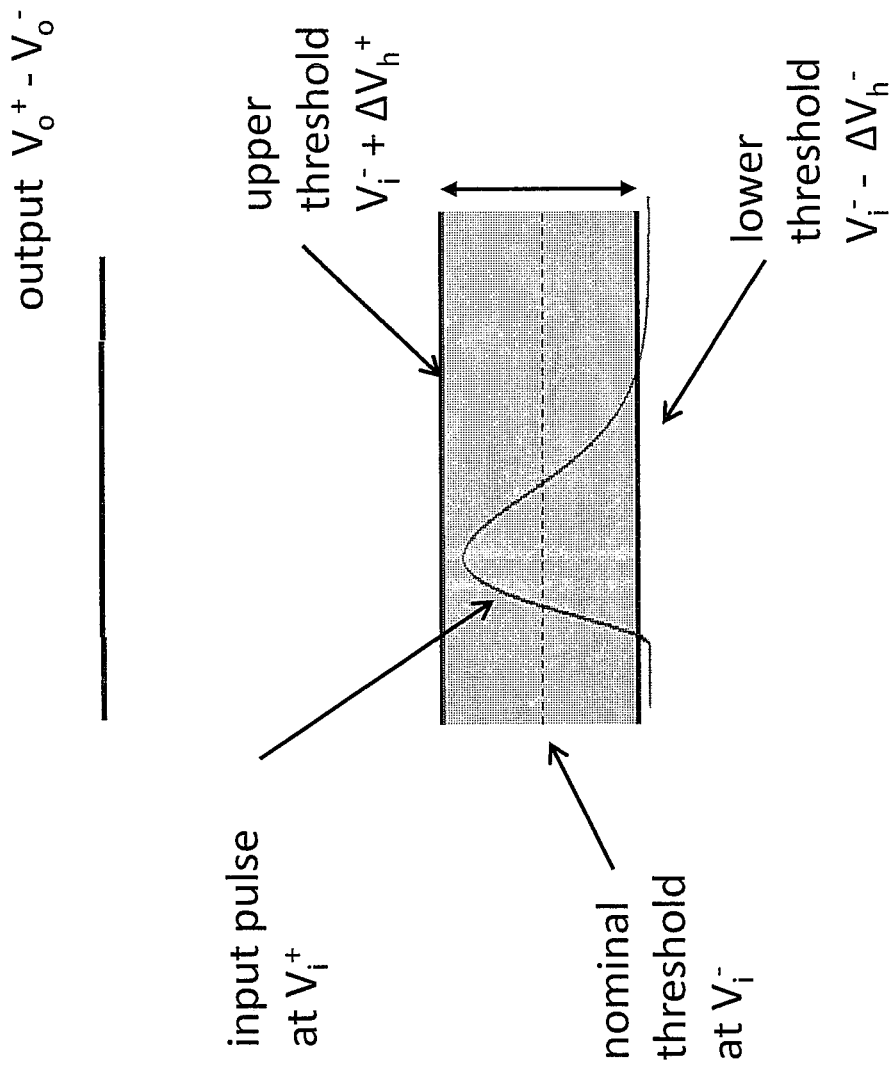
FIG. 5 is a diagram illustrating an example where a comparator is not responding to pulses with amplitudes lower than the hysteresis window from the prior art.
Figure 6A:
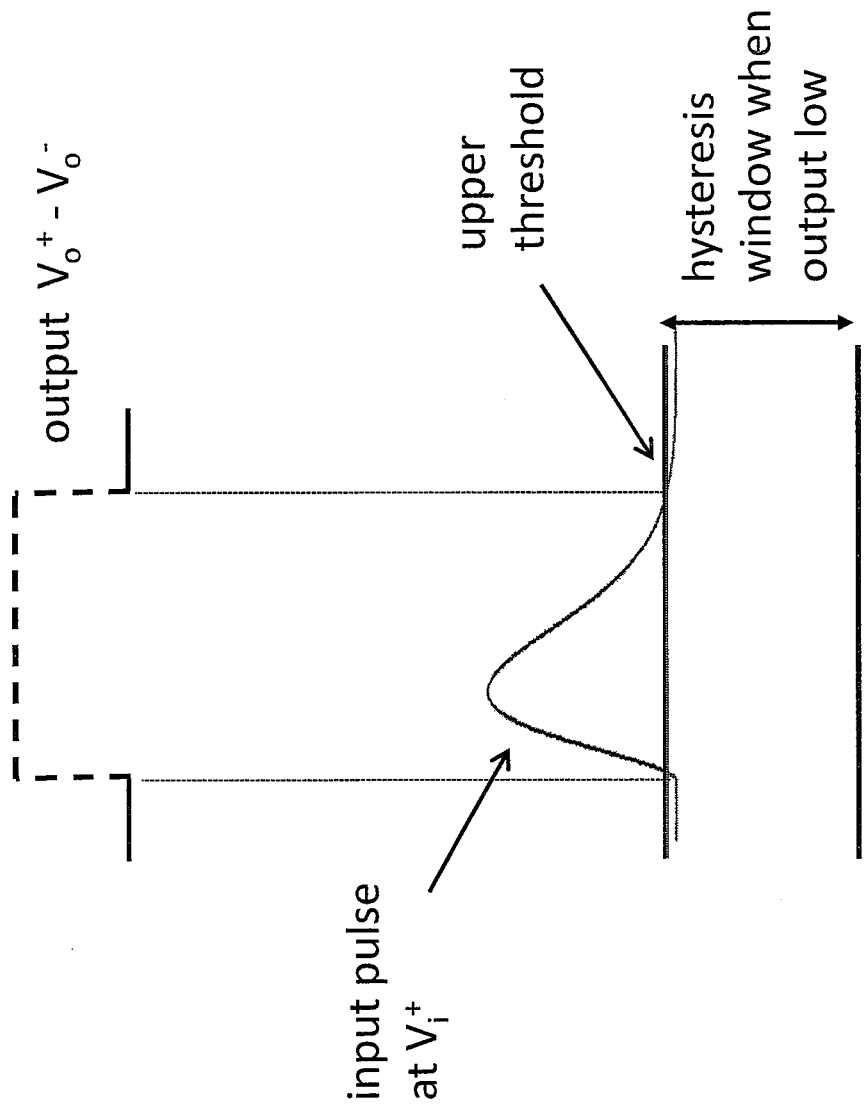
FIG. 6 ($a$) is a diagram illustrating the input and output of a comparator with sub-hysteresis discrimination before the comparator triggers.
Figure 6B:
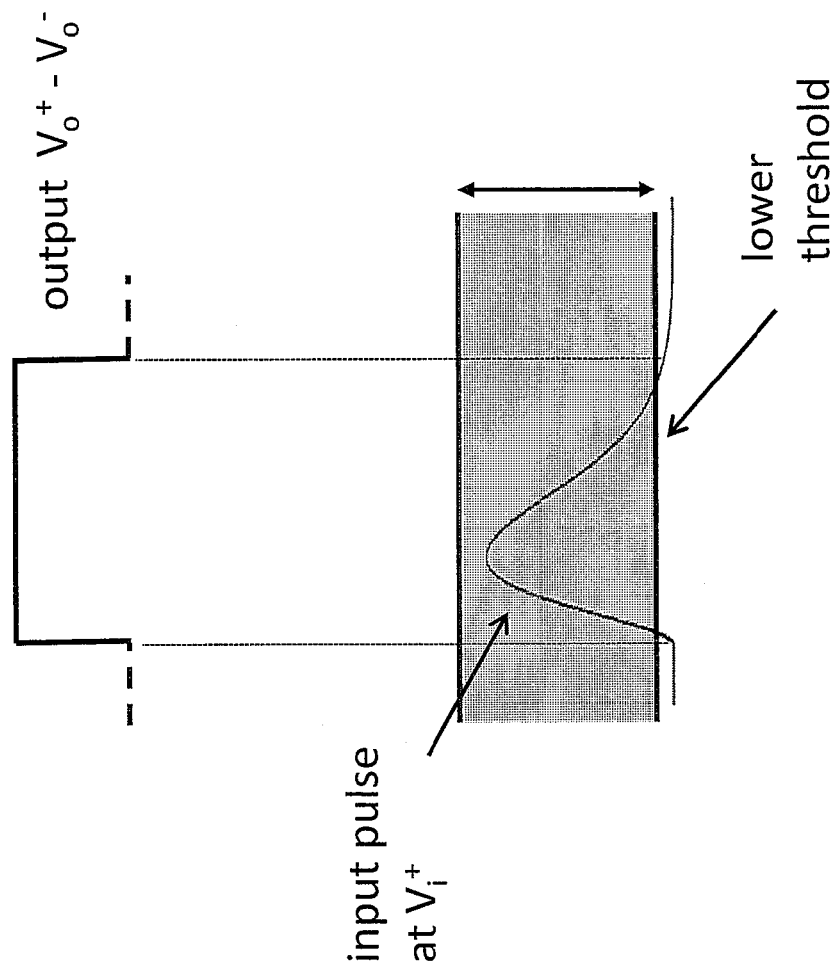

As discussed above, hysteresis of a comparator introduces a limitation on the minimum pulse amplitude that the comparator can discriminate, and the minimum pulse amplitude that can be discriminated cannot be lower than the hysteresis window. One way to reduce the effect of the limitation of the minimum pulse amplitude that can be discriminated is illustrated in FIG. 6. In the initial state of a comparator, the upper threshold can be set slightly higher than the baseline of a pulse to be discriminated. FIG. 6(a) illustrates the position of the hysteresis window before the comparator triggers. The output is low. When the upper threshold is exceeded, i.e., the comparator triggers and the output is high, as illustrated in FIG. 6(b), the hysteresis window can be modified to have a lower threshold slightly higher than the baseline of the pulse. In this way the comparator can discriminate pulses with amplitude lower than the hysteresis window, thus achieving small pulse (i.e., pulses with amplitudes below the hysteresis window) discrimination. This is called sub-hysteresis discrimination.

Figure 7A:
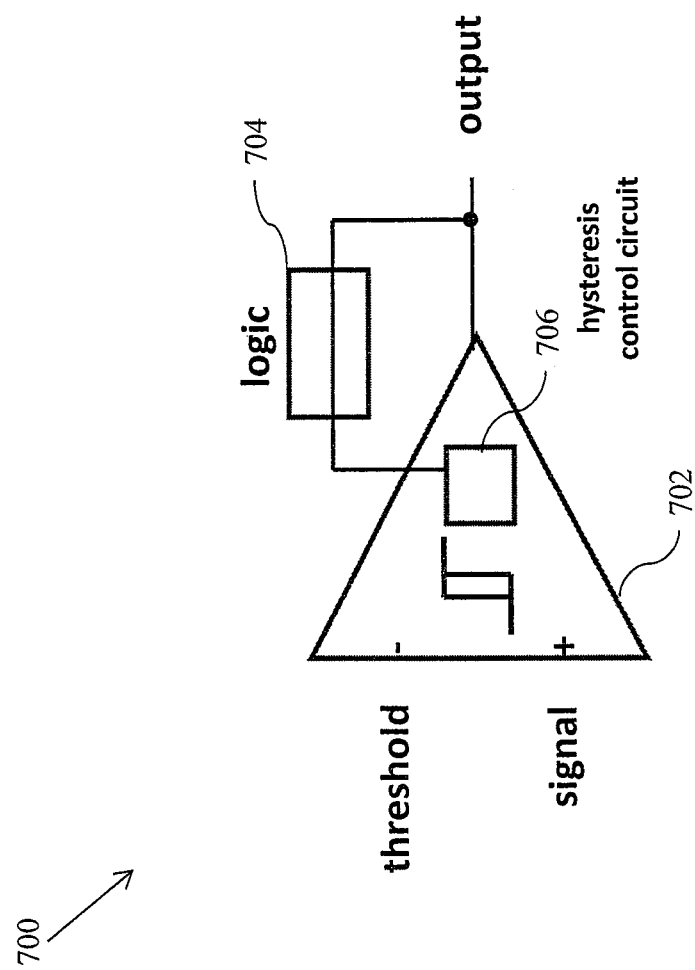
FIG. 7($a$) is a block diagram illustrating a discriminator with sub-hysteresis discrimination.

FIG. 7(a) is a block diagram illustrating an embodiment of a discriminator 700 with sub-hysteresis discrimination. The discriminator 700 includes a comparator circuit 702 and a logic circuit 704. The comparator circuit 702 includes a hysteresis control circuit 706. The comparator circuit 702 compares an input signal with a pre-determined threshold, and the output of the comparator circuit 702 is applied back to the hysteresis control circuit 706 through the logic circuit 704 for hysteresis control of the comparator circuit 702. The hysteresis control circuit 706 provides both sub-hysteresis discrimination and positive feedback, thus achieving at the same time small pulse discrimination and high speed discrimination. The discriminator 700 can be applied to very low amplitude signals that need to be discriminated within a relatively short time.

Figure 7B:
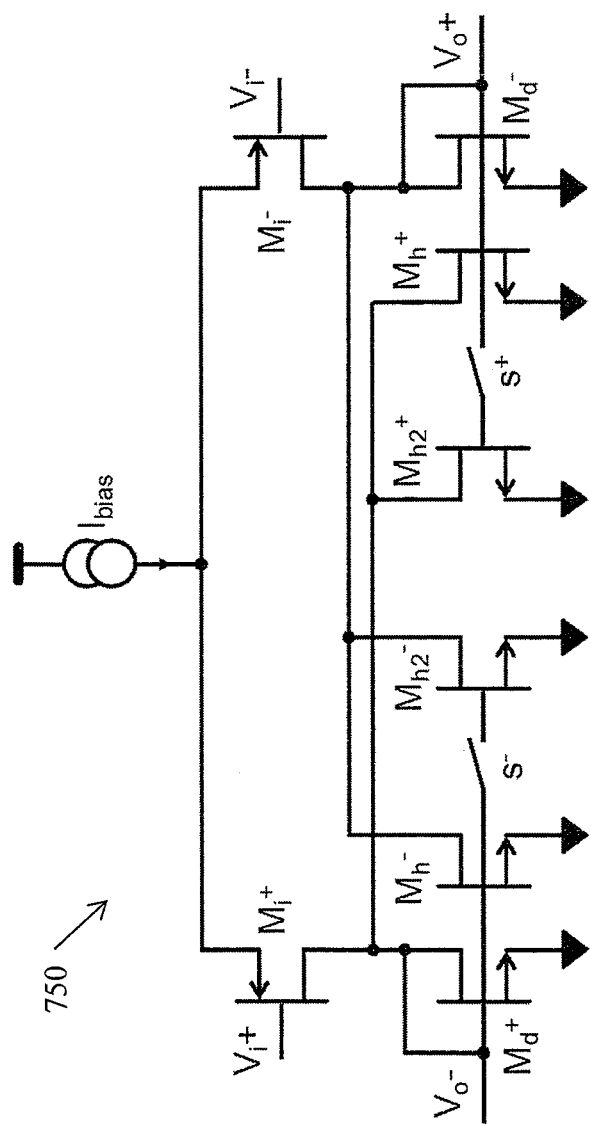

FIG. 7(b) is an embodiment of a circuit 750 for the comparator circuit 702 in FIG. 7(a). The circuit 750 compares signals at the positive input $V_i^+$ with signals at the negative input $V_i^-$. The circuit 750 includes a current source $I_{bias}$, a differential input circuit including transistors $M_i^+$ and $M_i^-$, and an output circuit coupled with the differential input circuit. The output circuit includes two transistors $M_d^+$ and $M_d^-$ providing two output voltages $V_o^-$ and $V_o^+$. The circuit 750 also includes a positive feedback circuit coupled between the differential input circuit and the output circuit. The positive feedback circuit includes two positive feedback transistors $M_h^+$ and $M_h^-$. The difference between $V_o^-$ and $V_o^+$ indicates the voltage difference between $V_i^+$ and $V_i^-$. The comparator circuit 750 also includes a hysteresis control circuit coupled with the positive feedback circuit, and the hysteresis control circuit includes transistors $M_{h2}^-$ and $M_{h2}^+$. The transistor $M_{h2}^-$ is connected with the transistor $M_h^-$ in parallel through a switch $S^-$, where the gate of $M_{h2}^-$ is connected with the gate of the transistor $M_h^-$ through the switch $S^-$, and the source of $M_{h2}^-$ is connected with the source of the transistor $M_h^-$. The transistor $M_{h2}^+$ is connected with the transistor $M_h^+$ in parallel through a switch $S^+$, where the gate of $M_{h2}^+$ is connected with the gate of the transistor $M_h^+$ through the switch $S^+$, and the source of $M_{h2}^+$ is connected with the source of the transistor $M_h^+$.

Switches $S^+$ and $S^-$ can be any applicable switching devices, and are used to effectively adjust the amount of positive feedback. The amount of positive feedback is adjusted by adding additional transistors connected in parallel to $M_h^+$ and $M_h^-$, utilizing switches connected either at the gates or at the drains or sources of these additional transistors. By modifying the amount of positive feedback, it is possible to control the position and size of the hysteresis window of the discriminator 700. FIG. 7(b) illustrated an example of a comparator circuit where transistors $M_{h2}^+$ and $M_{h2}^-$ are added to allow the position and size of the hysteresis window to be adjusted to two different values. Additional logic and transistors can be added to make the position and size programmable to an arbitrary number of values.

The size and position of the hysteresis window can be controlled by the output of the comparator circuit 750 through the logic circuit 704 as illustrated in FIG. 7(a). The hysteresis is initially set as shown in FIG. 6(a) by closing the switch $S^-$ for $M_{h2}^-$ and opening the switch $S^+$ for $M_{h2}^+$. When a signal crosses the upper threshold, the comparator circuit 750 triggers and the hysteresis window is moved to a new position, such as that illustrated in FIG. 6(b), by closing the switch $S^+$ for $M_{h2}^+$ and opening the switch $S^-$ for $M_{h2}^-$. Once the comparator circuit 750 triggers back, i.e., the input signal crosses the lower threshold, the hysteresis window is moved back to the initial position. In this way, the comparator circuit 750 is able to achieve sub-hysteresis discrimination as shown in FIG. 6, while maintaining the positive feedback required for the high speed.

Figure 7C:
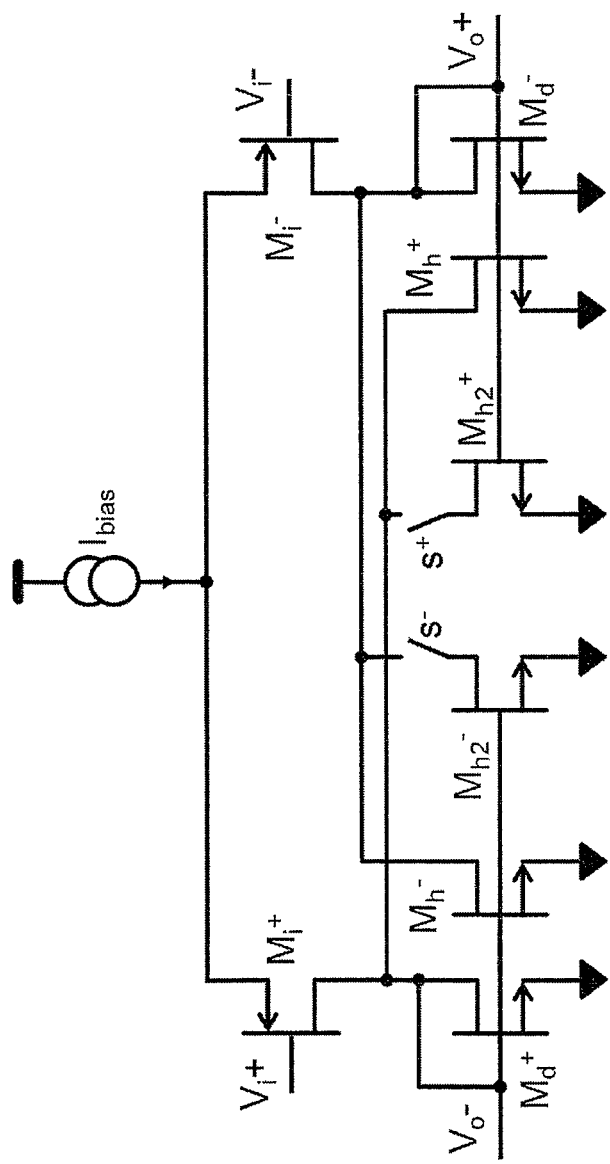

$M_{h2}^+$ and $M_{h2}^-$ are hysteresis control transistors and are part of the hysteresis control circuit. The two hysteresis control transistors can be modified in size to provide desired hysteresis levels, and can be enabled by switches connected in series with the gates of the hysteresis control transistors, as illustrated in FIG. 7(b). The switches may also be placed in different positions like, for example, at the drain or the source of the positive feedback transistors in parallel. FIG. 7(c) illustrates another embodiment of the comparator circuit 702 in FIG. 7(a), where the hysteresis control circuit includes two hysteresis control transistors $M_{h2}^+$ and $M_{h2}^-$ that are connected in parallel with positive feedback transistor $M_h^+$ and $M_h^-$, respectively, at the sources of the hysteresis control transistors and the positive feedback transistors through switches $S^+$ and $S^-$.

Figure 8:
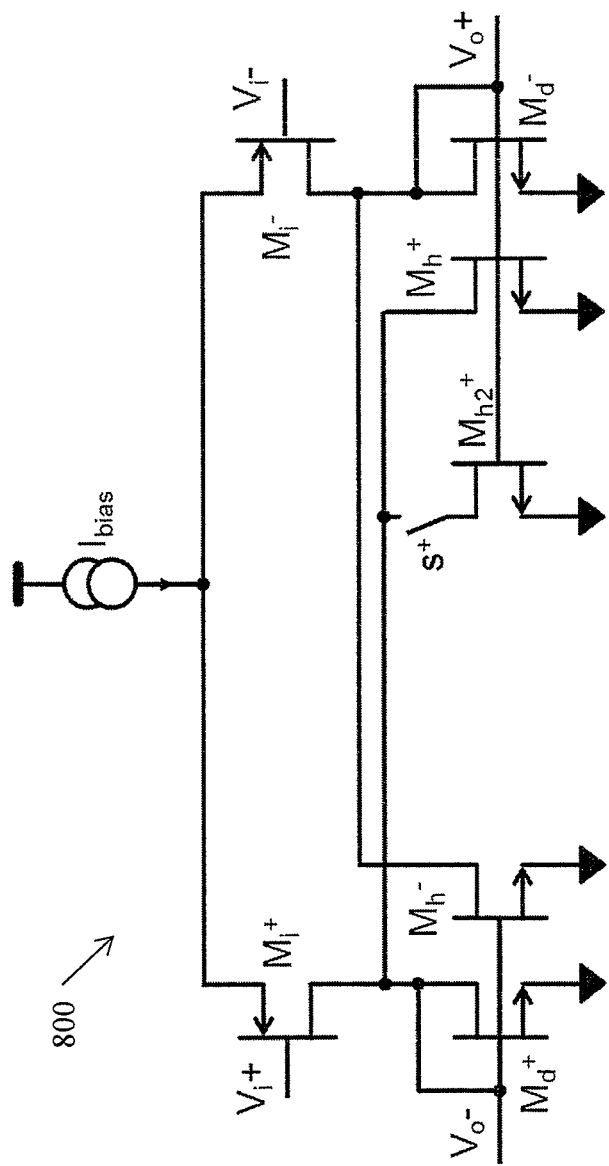
FIG. 8 is a schematic diagram illustrating a comparator circuit with sub-hysteresis discrimination.

In another embodiment the hysteresis control can be limited to one side only of the differential pair of the comparator circuit, for example, by using only the $M_{h2}^+$ or $M_{h2}^-$ in FIG. 7(b) or FIG. 7(c). FIG. 8 illustrates a comparator circuit 800 that has hysteresis control on one side of the differential pair of the comparator circuit 800. A hysteresis control transistor $M_{h2}^+$ has a source that is connected with a positive feedback transistor $M_h^+$ through a switch $S^+$, and the gate of $M_{h2}^+$ is connected with the gate of $M_h^+$.

Figure 9:
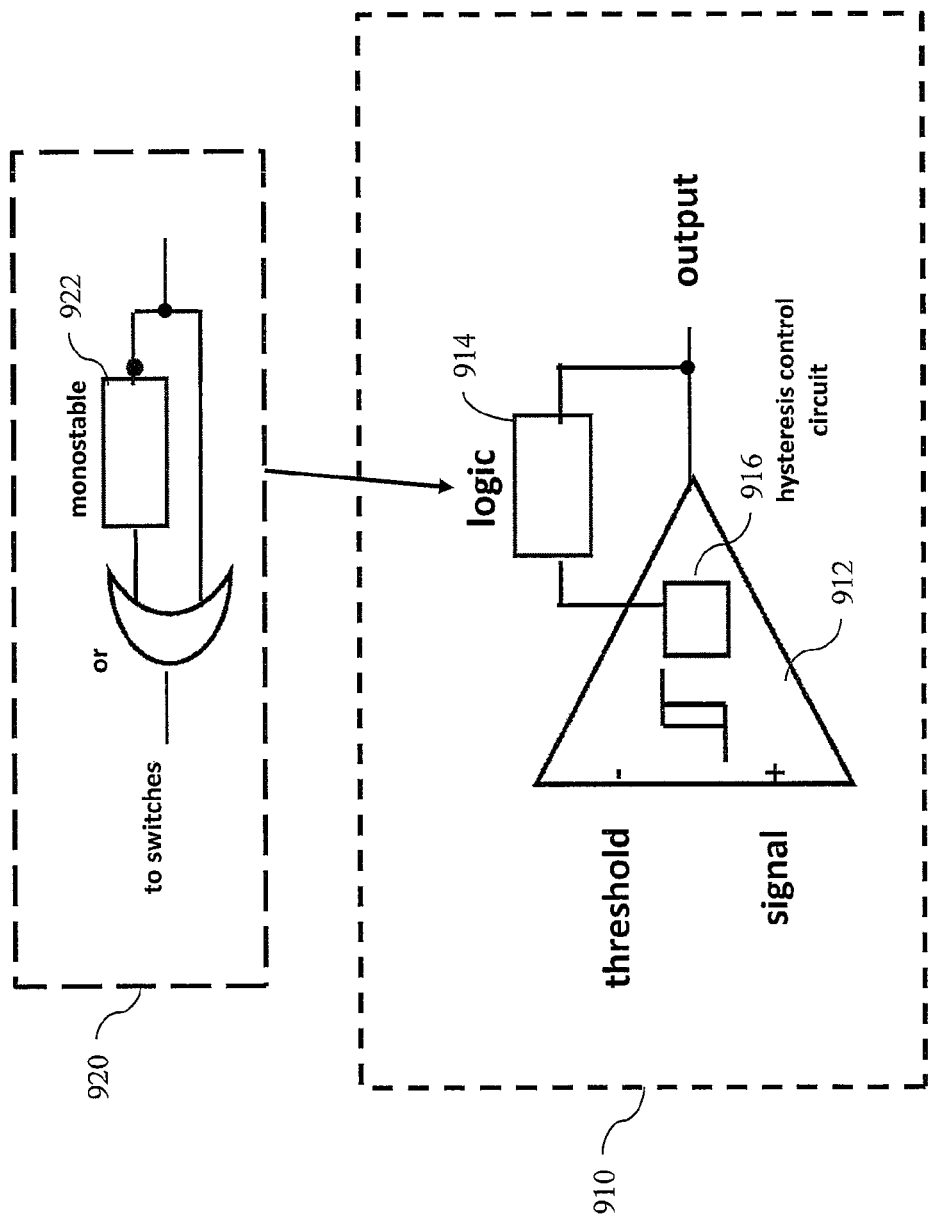
FIG. 9 is a block diagram illustrating a discriminator with sub-hysteresis discrimination.

Logic can be added to the hysteresis control circuit 706 of FIG. 7(a) to introduce additional features like, for example, keeping the hysteresis window in one of the available positions for a controlled amount of time. FIG. 9 illustrates a block diagram of a discriminator 910 with sub-hysteresis discrimination similar to the discriminator in FIG. 7(a). The output of a comparator circuit 912 is fed back to a hysteresis control circuit 916 of the comparator circuit 912 through a logic circuit 914. A circuit 920 is used to control the logic circuit 914, which subsequently controls the hysteresis control circuit 916 so that the comparator circuit 912 can keep the hysteresis window in the shifted position for a controlled amount of time after the comparator triggers back. The amount of time can be set by the monostable 922.

It will be appreciated by persons skilled in the art that the present disclosure is not limited to what has been particularly shown and described hereinabove. Rather, the scope of the present invention is defined by the claims which follow. It should further be understood that the above description is only representative of illustrative examples of embodiments. For the reader's convenience, the above description has focused on a representative sample of possible embodiments, a sample that teaches the principles of the present invention. Other embodiments may result from a different combination of portions of different embodiments.

The description has not attempted to exhaustively enumerate all possible variations. That alternate embodiments may not have been presented for a specific portion of the invention, and may result from a different combination of described portions, or that other undescribed alternate embodiments may be available for a portion, is not to be considered a disclaimer of those alternate embodiments. It will be appreciated that many of those undescribed embodiments are within the literal scope of the following claims, and others are equivalent. Furthermore, all references, publications, U.S. patents, and U.S. patent application Publications cited throughout this specification are hereby incorporated by reference as if fully set forth in this specification.

The invention claimed is:

1. A discriminator, comprising a comparator circuit, the comparator circuit comprising:
    a differential input circuit comprising a first transistor coupled with a first signal input and a second transistor coupled with a second signal input;
    an output circuit comprising a third transistor generating a first output signal and a fourth transistor generating a second output signal, the difference between the first output signal and the second output signal being indicative of the voltage difference between the first signal input and the second signal input;
    a positive feedback circuit operably coupled between the differential input circuit and the output circuit, comprising a fifth transistor having a first terminal, a second terminal and a third terminal, and a sixth transistor having a first terminal, a second terminal and a third terminal;
    a hysteresis control circuit operably coupled with the positive feedback circuit, comprising a seventh transistor having a first terminal, a second terminal and a third terminal, and a first switching device, the first terminal of the seventh transistor being coupled with the first terminal of the fifth transistor of the positive feedback circuit through the first switching device, and the second terminal of the seventh transistor being coupled with the second terminal of the fifth transistor of the positive feedback circuit.

2. The discriminator of claim 1, wherein the hysteresis control circuit further comprises an eighth transistor having a first terminal, a second terminal and a third terminal, and a second switching device, the first terminal of the eighth transistor being coupled with the first terminal of the sixth transistor of the positive feedback circuit through the second switching device, and the second terminal of the eighth transistor being coupled with the second terminal of the sixth transistor of the positive feedback circuit.

3. A comparator circuit, comprising:
    a differential input circuit comprising a first transistor coupled with a first signal input and a second transistor coupled with a second signal input;
    an output circuit comprising a third transistor generating a first output signal and a fourth transistor generating a second output signal, the difference between the first output signal and the second output signal being indicative of the voltage difference between the first signal input and the second signal input;
    a positive feedback circuit operably coupled between the differential input circuit and the output circuit, comprising a fifth transistor having a first terminal, a second terminal and a third terminal, and a sixth transistor having a first terminal, a second terminal and a third terminal;
    a hysteresis control circuit operably coupled with the positive feedback circuit, comprising a seventh transistor having a first terminal, a second terminal and a third terminal, and a first switching device, the first terminal of the seventh transistor being coupled with the first terminal of the fifth transistor of the positive feedback circuit through the first switching device, and the second terminal of the seventh transistor being coupled with the second terminal of the fifth transistor of the positive feedback circuit.

4. The comparator circuit of claim 3, wherein the hysteresis control circuit further comprises an eighth transistor having a first terminal, a second terminal and a third terminal, and a second switching device, the first terminal of the eighth transistor being coupled with the first terminal of the sixth transistor of the positive feedback circuit through the second switching device, and the second terminal of the eighth transistor being coupled with the second terminal of the sixth transistor of the positive feedback circuit.

* * * * *